(12) United States Patent
Matsuura et al.

(10) Patent No.: US 8,384,119 B2
(45) Date of Patent: Feb. 26, 2013

(54) LIGHT EMITTING DEVICE

(75) Inventors: Shingo Matsuura, Higashiomi (JP); Daisuke Sakumoto, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 92 days.

(21) Appl. No.: 12/810,487

(22) PCT Filed: Dec. 25, 2008

(86) PCT No.: PCT/JP2008/073591
§ 371 (c)(1),
(2), (4) Date: Dec. 8, 2010

(87) PCT Pub. No.: WO2009/081980
PCT Pub. Date: Jul. 2, 2009

(65) Prior Publication Data
US 2011/0084295 A1     Apr. 14, 2011

(30) Foreign Application Priority Data

Dec. 25, 2007 (JP) ................. 2007-332913
Dec. 25, 2007 (JP) ................. 2007-332914
Dec. 26, 2007 (JP) ................. 2007-333716

(51) Int. Cl.
*H01L 33/48* (2010.01)

(52) U.S. Cl. ..... 257/99; 257/98; 257/100; 257/E33.058; 257/E33.059

(58) Field of Classification Search ............ 257/98–100, 257/E33.056, E33.058, E33.059; 313/512
See application file for complete search history.

(56) References Cited

U.S. PATENT DOCUMENTS

| 6,426,274 B1 | 7/2002 | Tayanaka | |
|---|---|---|---|
| 2005/0007783 A1 | 1/2005 | Ono | 362/294 |
| 2007/0075451 A1* | 4/2007 | Winter et al. | 264/126 |
| 2008/0210965 A1* | 9/2008 | Hung | 257/98 |

FOREIGN PATENT DOCUMENTS

| jp | 2005-123457 | 5/2005 |
|---|---|---|
| JP | 2006-287132 | 10/2006 |
| JP | 2007-080870 | 3/2007 |
| JP | 2007-214592 | 8/2007 |

* cited by examiner

*Primary Examiner* — Kenneth Parker
*Assistant Examiner* — Yu Chen
(74) *Attorney, Agent, or Firm* — DLA Piper LLP (US)

(57) ABSTRACT

A light emitting device includes a light emitting element, a base, and a transparent layer. The base has an upper side portion including a first portion and a second portion. The first portion includes a mounting region of the light emitting element, and has a first porosity. The second portion surrounds the first portion, includes a plurality of transparent particles, and has a second porosity larger than the first porosity. The light transmitting layer encapsulates the light emitting element, and is attached to the first portion in a state where the transparent layer is apart from the second portion.

9 Claims, 11 Drawing Sheets

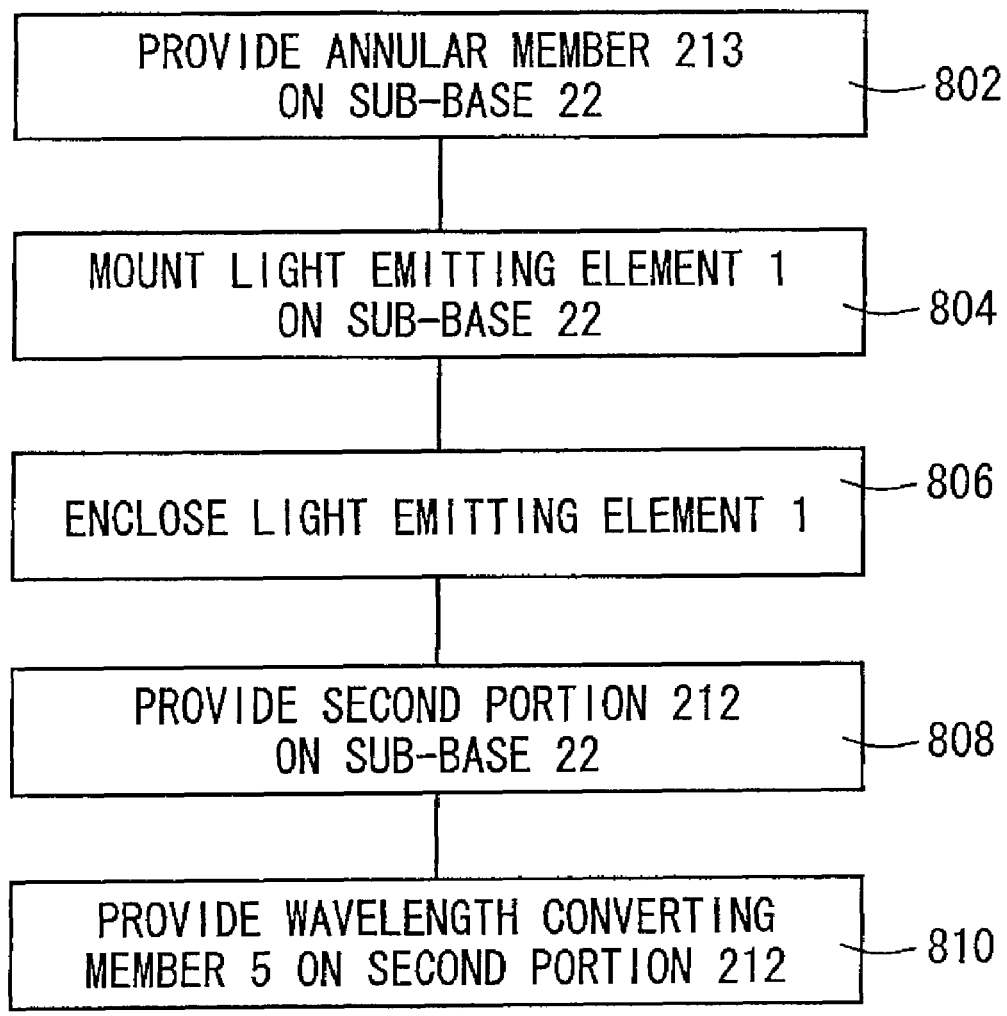

LIGHT EMITTING DEVICE

CROSS-REFERENCE TO THE RELATED APPLICATIONS

This application is a national stage of international application No. PCT/JP2008/073591, filed on Dec. 25, 2008, and claims the benefit of priority under 35 USC 119 to Japanese Patent Application No. 2007-332913, filed on Dec. 25, 2007, Japanese Patent Application No. 2007-332914, filed on Dec. 25, 2007 and Japanese Patent Application No. 2007-333716, filed on Dec. 26, 2007, the entire contents of all of which are incorporated herein by reference.

TECHNICAL FIELD

The present invention relates to a light emitting device having a light emitting element such as a light emitting diode.

BACKGROUND ART

In recent years, development of a light emitting device having a light emitting element such as a light emitting diode is progressing. There are expectations for a light emitting device having a light emitting element from the point of view of power consumption, product lifespan, and the like.

DISCLOSURE OF INVENTION

Further improvement is demanded of a light emitting device having a light emitting element with respect to light emitting characteristics such as luminescence intensity. In order to improve the light emitting characteristics of a light emitting device, it is necessary, for example, to reduce loss of light emitted from the light emitting element.

According to one aspect of the invention, a light emitting device includes a light emitting element, a base, and a transparent layer. The base has an upper side portion including a first portion and a second portion. The first portion includes a mounting region of the light emitting element, and has a first porosity. The second portion surrounds the first portion, includes a plurality of transparent particles, and has a second porosity larger than the first porosity. The transparent layer encapsulates the light emitting element, and is attached to the first portion in a state where the transparent layer is apart from the second portion.

BRIEF DESCRIPTION OF DRAWINGS

Other and further objects, features, and advantages of the invention will be more explicit from the following detailed description taken with reference to the drawings wherein:

FIG. 8 illustrates an exemplified manufacturing method of the light emitting device illustrated in FIGS. 4 and 5;

BEST MODE FOR CARRYING OUT THE INVENTION

Figure 1:
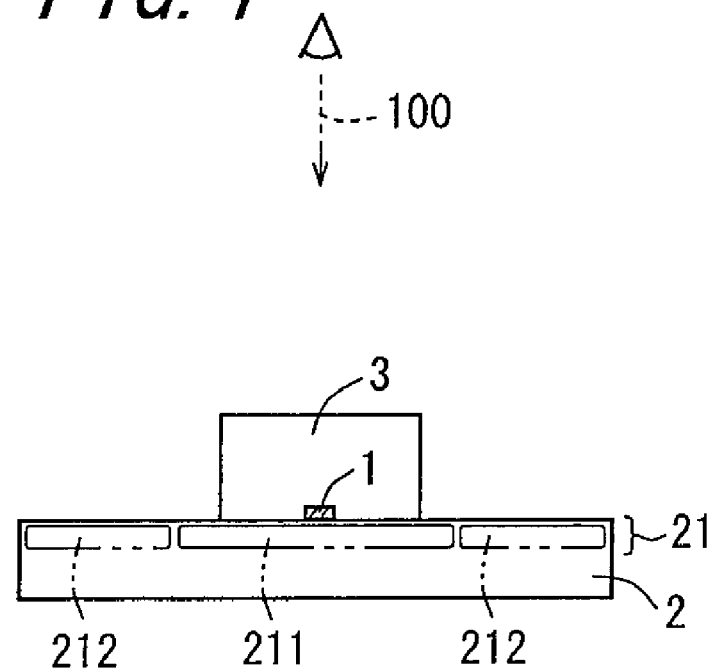
FIG. 1 illustrates a concept of the invention.
Figure 2:
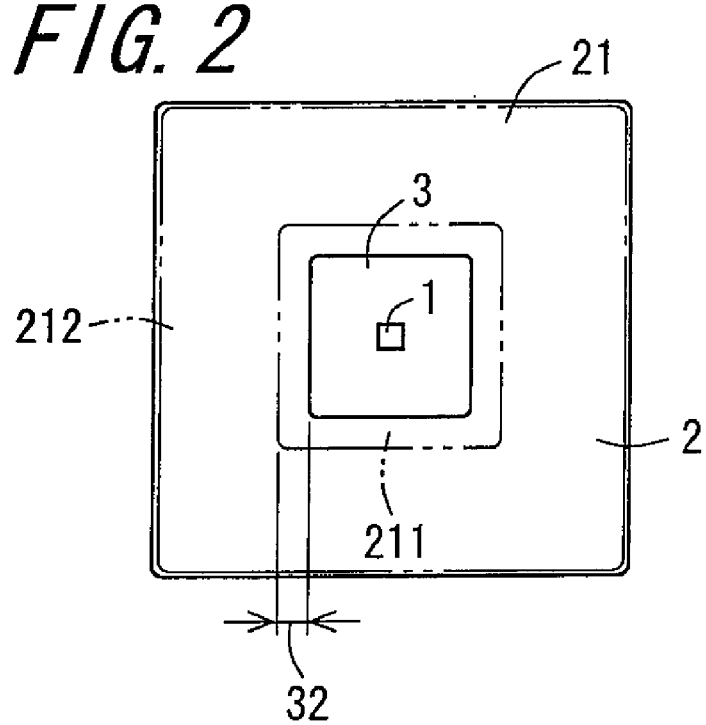
FIG. 2 illustrates a plan view in a line of sight 100 of FIG. 1.

Hereinafter, a concept of the invention will be described, referring to FIGS. 1 and 2. A light emitting device includes a light emitting element 1, a base 2, and a transparent layer 3.

The light emitting element 1 is mounted on the base 2. The exemplified light emitting element 1 is a light emitting diode including a semiconductor material. The light emitting element 1 emits a primary light in dependence on drive power.

The base 2 has an upper side portion 21 including a first portion 211 and a second portion 212. The first portion 211 has a first porosity. The second portion 212 surrounds the first portion 211. The second portion 212 includes a plurality of transparent particles, and has a second porosity larger than the first porosity.

Figure 3:
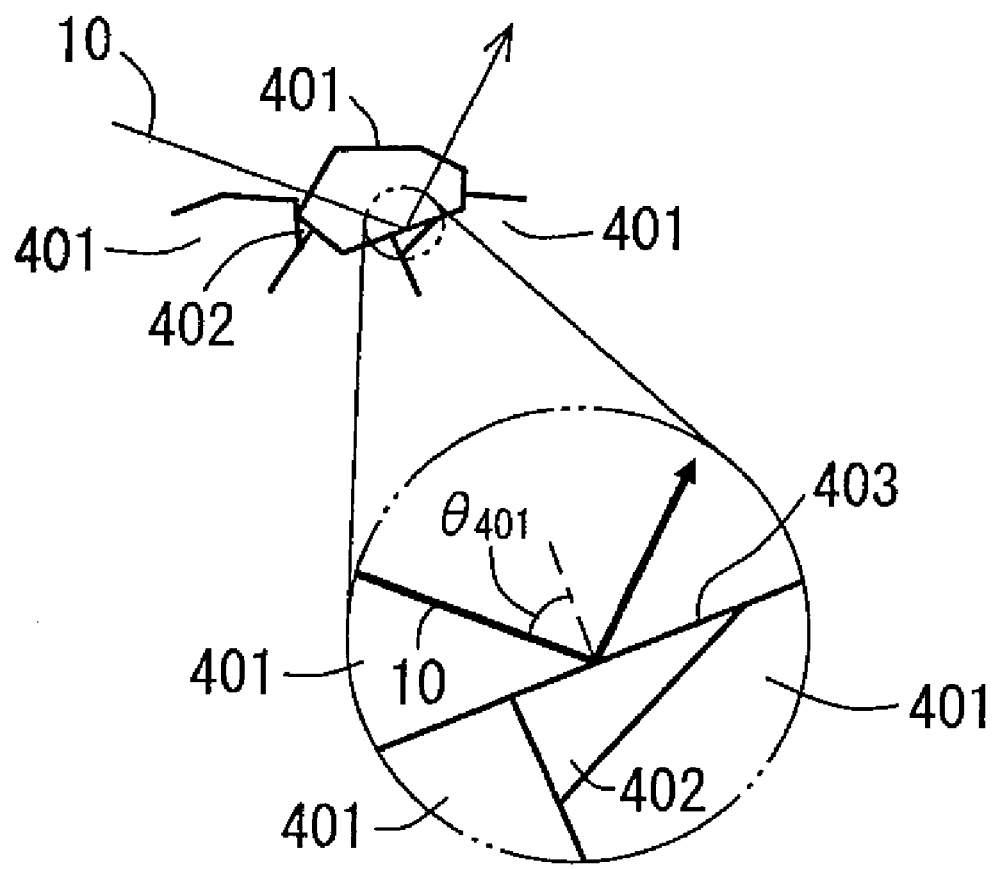
FIG. 3 illustrates a structure of a second portion illustrated in FIGS. 1 and 2.

A structure of the second portion 212 will be described, referring to FIG. 3. A plurality of transparent particles 401 are partially integrated. A plurality of cells 402 exist among the plurality of transparent particles 401. The transparent particles 401 have a refractive index larger than that of the cells 402. A primary light 10 emitted from the light emitting element 1 enters the transparent particles 401. An interface 403 between the transparent particles 401 and cells 402 reflects the primary light 10 having entered the transparent particles 401 with total reflection. In the case that the primary light 10 has an angle of incidence $\theta_{401}$ equal to or greater than a critical angle $\theta_{403}$, the interface 403 reflects the primary light 10 with total reflection. The critical angle $\theta_{403}$ is expressed by the following equation.

$$\sin \theta_{403} = n_{402}/n_{401}$$

Here, $n_{401}$ represents the refractive index of the transparent particles 401, and $n_{402}$ represents the refractive index of the cells 402.

Referring again to FIGS. 1 and 2, the transparent layer 3 is attached to the first portion in a state where the transparent layer 3 is apart from the second portion. Herein, "apart" means that a distance 32 exists between the transparent layer 3 and second portion 212, as illustrated in FIG. 2. The transparent layer 3 encapsulates the light emitting element 1.

Hereinafter, a number of exemplified embodiments of the invention will be described, referring to the drawings.

Figure 4:
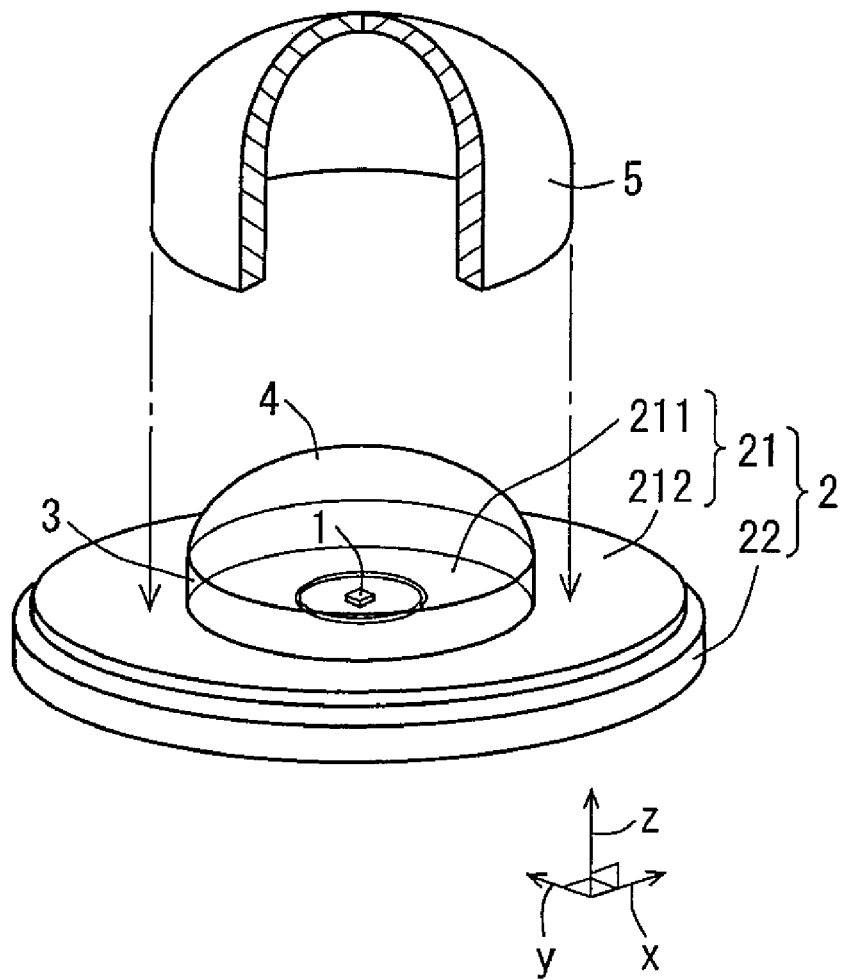
FIG. 4 illustrates a light emitting device according to one embodiment of the invention.
Figure 5:
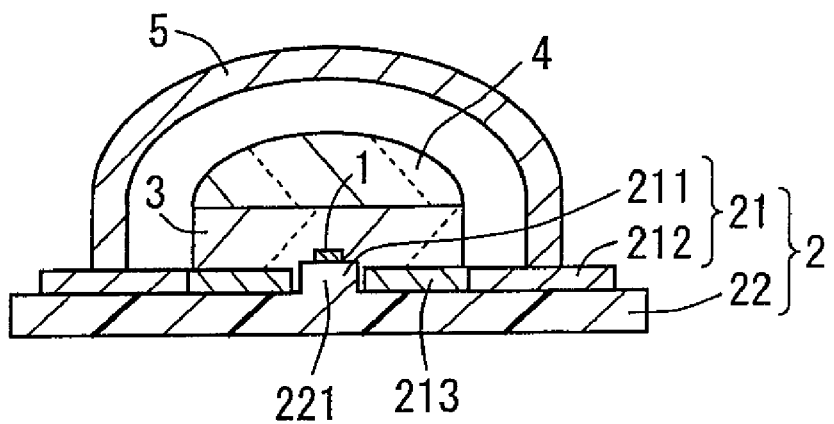
FIG. 5 illustrates a sectional view of the light emitting device illustrated in FIG. 4.

As illustrated in FIGS. 4 and 5, a light emitting device according to one embodiment of the invention includes the light emitting element 1, the base 2, and the transparent layer 3. The light emitting device further includes a lens 4 and a wavelength converting member 5. In FIG. 4, the wavelength converting member 5 is partially omitted in order to illustrate the internal structure of the wavelength converting member 5. In FIG. 4, the light emitting device is mounted on an xy plane in a hypothetical xyz space. In FIG. 4, an upward direction means the positive direction of a hypothetical z axis.

The light emitting element 1 is mounted on the base 2. The exemplified light emitting element 1 is a light emitting diode including a semiconductor material. The light emitting element 1 emits the primary light in dependence on drive power. The primary light has a peak emission wavelength included in a range of 395 nm to 410 nm.

The base 2 has the upper side portion 21 including the first portion 211 and second portion 212. The base 2 includes a sub-base 22 having a protruding portion 221. A mounting region of the light emitting element 1 is disposed on an upper surface of the protruding portion 221. The first portion 211 includes an annular member 213 and the protruding portion 221. The light emitting device of the embodiment is improved with respect to overall intensity by having a sub-base including the protruding portion 221. Consequently, the light emitting device is improved with respect to light emitting characteristics such as luminescence distribution.

Figure 6:
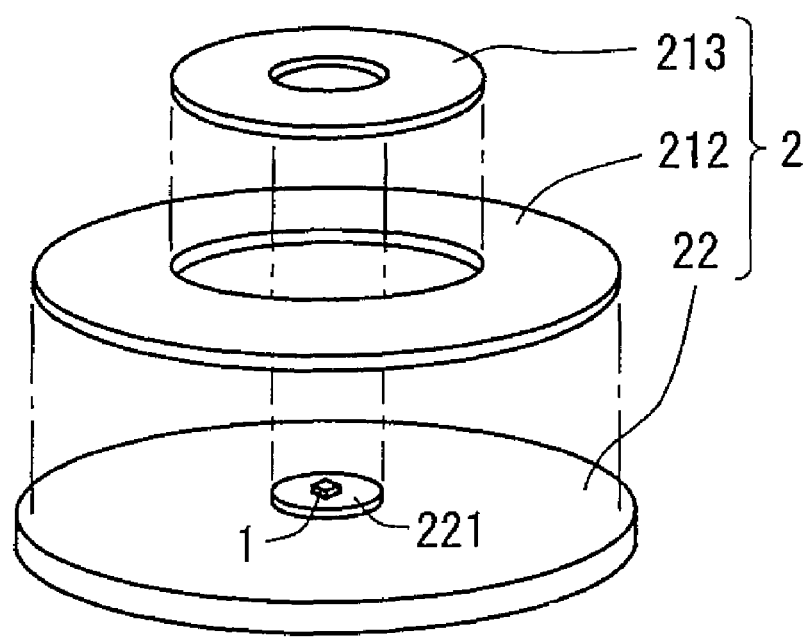
FIG. 6 illustrates s a base 2 illustrated in FIGS. 1 and 2.

As illustrated in FIG. 6, the exemplified annular member 213 has a ring shape. In FIG. 6, the base 2 is illustrated in an exploded manner. The annular member 213 is disposed on the sub-base 22, and surrounds the protruding portion 221 of the sub-base 22. The annular member 213 is made essentially of ceramics. The annular member 213 has a first porosity included in a range of 0.001% to 1%. An exemplified measurement method of the porosity of the annular member 213 according to the embodiment is a mercury intrusion method using Micromeritics Pore Sizer 9310.

The exemplified second portion 212 has a ring shape. The second portion 212 is disposed on the sub-base 22, and surrounds the first portion 211. The second portion 212 includes a plurality of transparent particles. The plurality of transparent particles are partially integrated. A plurality of cells exist among the plurality of transparent particles. The second portion 212 is formed in a porous shape. The second portion 212 has a second porosity included in a range of 15% to 43%. An exemplified measurement method of the porosity of the second portion 212 according to the embodiment is the mercury intrusion method using Micromeritics Pore Sizer 9310. The second porosity is larger than the first porosity. An exemplified second portion 212 is made essentially of ceramics.

Figure 7:
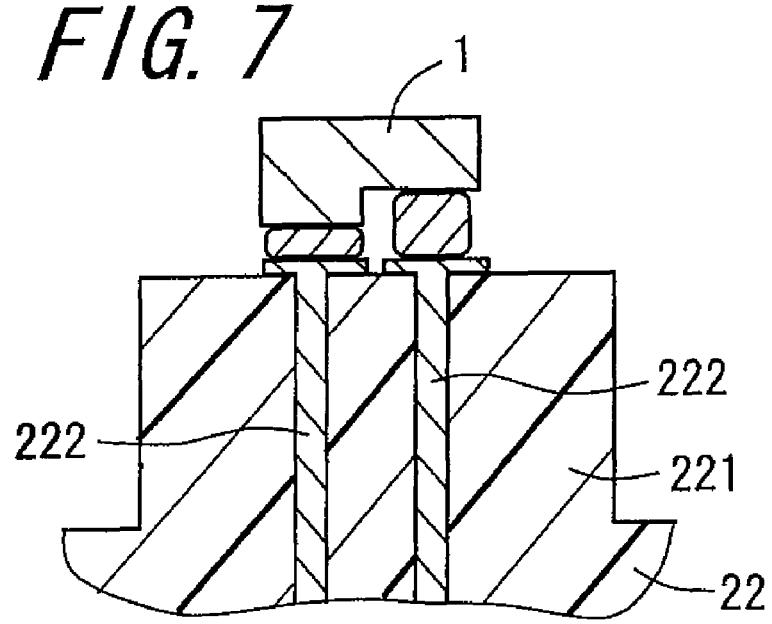
FIG. 7 illustrates a mounting structure of a light emitting element 1 illustrated in FIGS. 1 to 3.

The exemplified sub-base 22 is made essentially of ceramics. The sub-base 22 has a porosity included in the range of 0.001% to 1%. The measurement method of the porosity of the sub-base 22 according to the embodiment is the mercury intrusion method using Micromeritics Pore Sizer 9310. As illustrated in FIG. 7, the sub-base 22 has a plurality of electrical pathways 222. The light emitting element 1 is electrically connected to the plurality of electrical pathways 222 via a conductive jointing material. In the exemplified light emitting device, the light emitting element 1 is mounted on the protruding portion 221 of the sub-base 22 by means of a flip-chip connection.

Referring again to FIG. 4 and FIG. 5, the transparent layer 3 is disposed on the base 2. The transparent layer 3 is attached to the first portion 211 in a state where the transparent layer 3 is apart from the second portion 212, and encapsulates the light emitting element 1. The "transparence" of the layer 3 means that at least part of the primary light emitted from the light emitting element 1 can be transmitted. The exemplified transparent layer 3 is made essentially of a silicone resin. The transparent layer 3 is attached to an upper surface of the first portion 211.

The lens 4 is disposed on the transparent layer 3. The lens 4 has the transparence. The transparence of the lens 4 means that at least part of the primary light emitted from the light emitting element 1 can be transmitted. The exemplified lens 4 is made essentially of a glass material.

The wavelength converting member 5 is disposed on the base 2. The wavelength converting member 5 covers the light emitting element 1, the transparent layer 3, and the lens 4 with a void interposed thereamong. The wavelength converting member 5 has a dome shape. The wavelength converting member 5 emits a secondary light in dependence on the primary light emitted from the light emitting element 1. The wavelength converting member 5 includes a matrix member and a plurality of fluorescent particles. The matrix member includes a transparent material. The transparence of the matrix member means that at least part of the primary light emitted from the light emitting element 1 can be transmitted. An exemplified matrix material is a silicone resin. The plurality of fluorescent particles are excited by the primary light emitted from the light emitting element 1. The plurality of fluorescent particles emit the secondary light. The secondary light emitted from the plurality of fluorescent materials passes through the matrix material.

The light emitting device of the embodiment includes the second portion 212 formed in a porous shape. Consequently, the light emitting device is improved with respect to luminescence intensity. More specifically, by the second portion 212 being formed in a porous shape, the second portion is improved with respect to light reflection efficiency. The second portion 212 reflects the primary light and secondary light with total reflection.

The light emitting device according to the embodiment includes the first portion 211 and the transparent layer 3. The first portion has the first porosity, which is smaller than the second porosity of the second portion. The transparent layer 3 is attached to the first portion 211 in a state where the transparent layer 3 is apart from the second portion. Consequently, the light emitting device is improved with respect to light emitting characteristics such as luminescence distribution. By the first portion having the first porosity which is smaller than the second porosity of the second portion, the transparent layer 3 is improved with respect to shape. Deformation of the transparent layer 3 in the manufacturing process is reduced.

In the embodiment, the wavelength converting member 5 is bonded to the second portion 212, which is formed in a porous shape. Consequently, the light emitting device is improved with respect to luminescence intensity. Specifically, by the primary light emitted from the light emitting element 1 being reflected by the second portion 212, the primary light falling incident on the wavelength converting member 5 is increased. By the secondary light emitted from the wavelength converting member 5 being reflected by the second portion 212, the amount of luminescence of the light emitting device is increased.

Figure 9A:
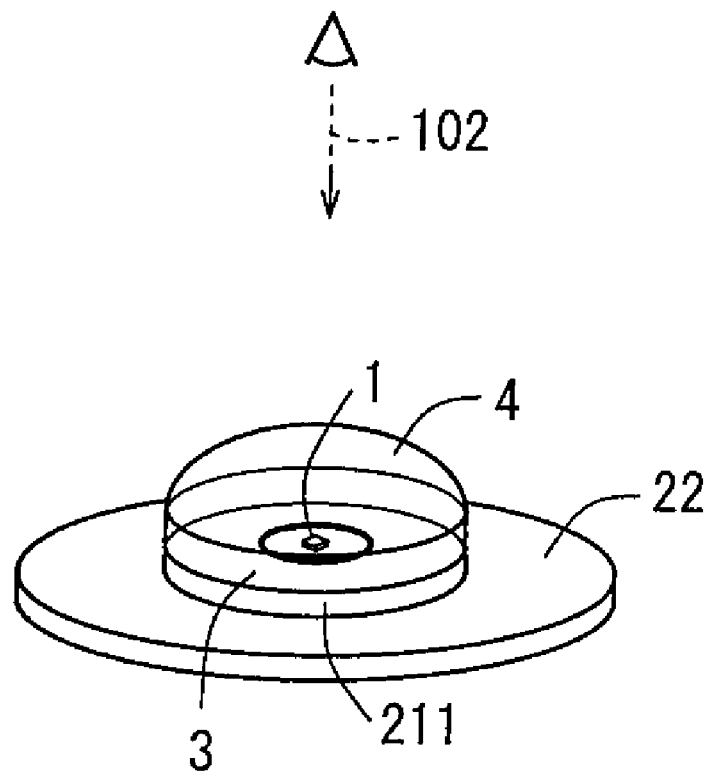
FIG. 9A illustrates a structure obtained in Step 806 illustrated in FIG. 8.
Figure 9B:
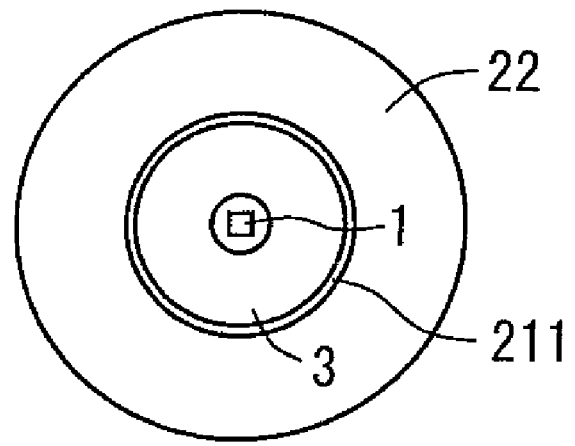
FIG. 9B illustrates a plan view in a line of sight 102 of FIG. 9A.

An exemplified manufacturing method of the light emitting device according to the embodiment includes the plurality of steps illustrated in FIG. 8. A step indicated by reference numeral 802 is providing the annular member 213 on the sub-base 22. The annular member 213 surrounds the protruding portion 221 of the sub-base 22, and is fixed to the sub-base 22 by a jointing member. A step indicated by reference numeral 804 is mounting the light emitting element 1 on the sub-base 22. A step indicated by reference numeral 806 is enclosing the light emitting element 1 with the transparent layer 3. An exemplified material of the transparent layer 3 is a silicone resin. A silicone resin in a softened state is disposed on the first portion 211 in a state where it encapsulates the light emitting element 1. Due to the first portion 211 not being porous, deformation of the silicone resin in the softened state is reduced. After the transparent layer 3 is disposed, the lens 4 is disposed on the transparent layer 3. As illustrated in FIGS. 9A and 9B, the transparent layer 3 is disposed entirely inward from an edge of the upper surface of the first portion 211.

Figure 10A:
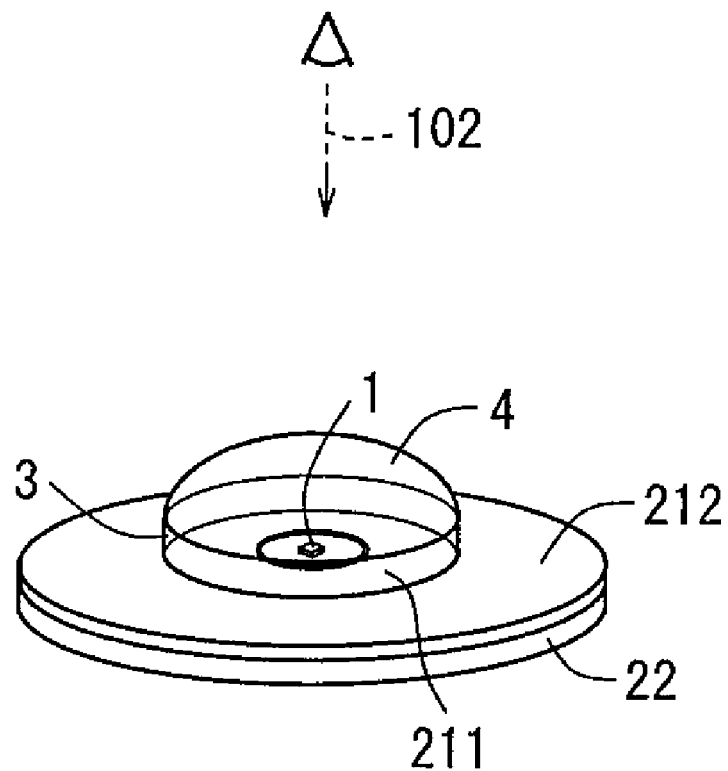
FIG. 10A illustrates a structure obtained in Step 806 illustrated in FIG. 8.
Figure 10B:
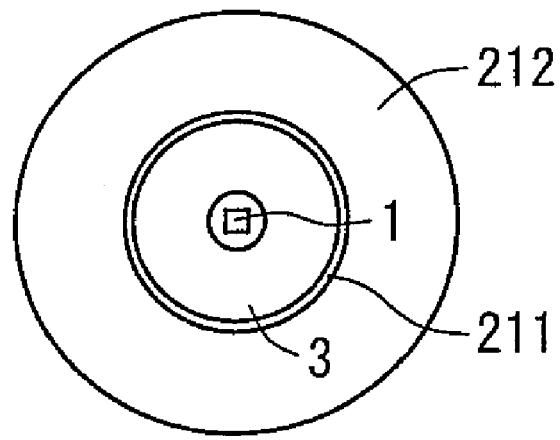
FIG. 10B illustrates a plan view in a line of sight 102 of FIG. 10A.

Referring again to FIG. 8, a step indicated by reference numeral 808 is providing the second portion on the sub-base 22. The second portion 212 surrounds the first portion 211, and is fixed to the sub-base 22 with a jointing member. As illustrated in FIGS. 10A and 10B, the transparent layer 3 is disposed entirely further inward from an inner edge of the upper surface of the second portion 212.

Referring again to FIG. 8, a step indicated by reference numeral 810 is providing the wavelength converting member 5 on the second portion 212. The wavelength converting member 5 is fixed to the second portion 212 with a jointing member. The wavelength converting member 5 is manufactured in advance, meaning that it is formed before being bonded to the second portion 212. Consequently, the wavelength converting member 5 is improved with respect to a change in shape in a step of being bonded to the second portion 212, which is formed in a porous form.

Figure 11:
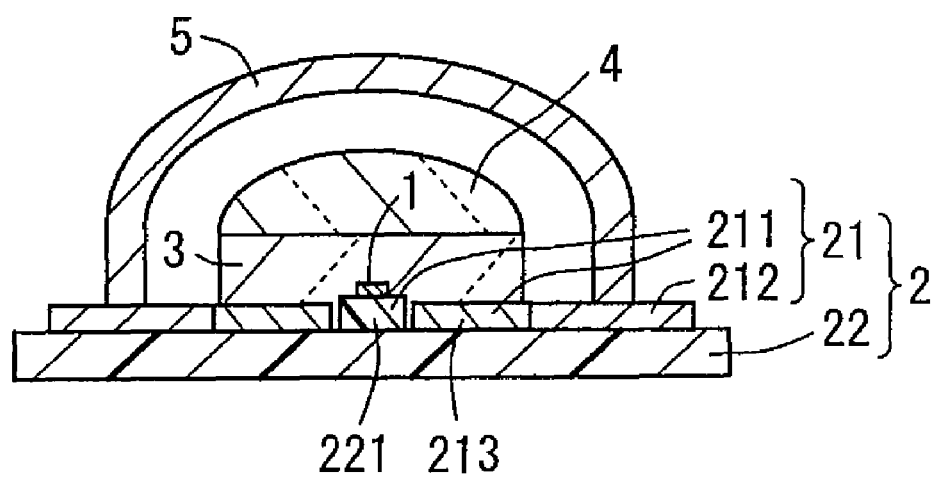
FIG. 11 illustrates a light emitting device according to another embodiment of the invention.

Referring to FIG. 11, another embodiment of the invention will be described. A light emitting device according to another embodiment includes the light emitting element 1, the base 2, and the transparent layer 3, in the same way as the light emitting device illustrated in FIGS. 4 and 5. The light emitting device further includes the lens 4 and the wavelength converting member 5.

In the light emitting device according to another embodiment, a point differing from the light emitting device illustrated in FIGS. 4 and 5 is the structure relating to the protruding portion 221 of the base 2. In the embodiment, the protruding portion 221 is a sub-mount substrate. Hereinafter, in the embodiment, the protruding portion 221 will be illustrated as a sub-mount substrate 221.

Figure 12:
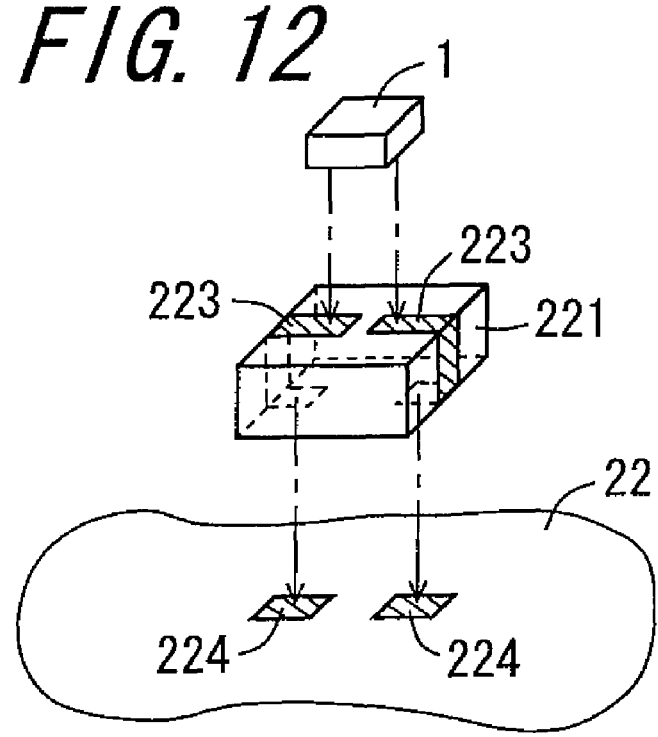
FIG. 12 illustrates a sub-mount substrate 221 illustrated in FIG. 11.

As illustrated in FIG. 12, the sub-mount substrate 221 is disposed on the sub-base 22. In FIG. 12, the light emitting element 1 and sub-mount substrate 221 are illustrated in a manner that they are disassembled from the sub-base 22. In FIG. 12, the sub-mount substrate 221 is illustrated in a see-through manner in order to illustrated the structure of the lower surface. In the sub-mount substrate 221, the structure illustrated in a see-through manner is indicated by dotted lines.

The sub-mount substrate 221 has a plurality of conductor patterns 223. The plurality of conductor patterns 223 are electrically connected to a plurality of conductor patterns 224 of the sub-base 22 by a conductive jointing material. The exemplified sub-mount substrate 221 is made essentially of silicon. Another exemplified sub-mount substrate is made essentially of ceramics.

The light emitting element 1 is electrically connected to the plurality of conductor patterns 223 of the sub-mount substrate 221 by a conductive jointing material. The light emitting element 1 is mounted on the upper surface of the sub-mount substrate 221.

The light emitting device according to the embodiment is improved with respect to heat control by including the sub-mount substrate 221. More specifically, the light emitting device is improved with respect to heat control by including the sub-mount substrate 221, which has higher heat conductivity than the annular member 213. Consequently, the light emitting device according to the embodiment is improved with respect to light emitting characteristics.

Due to the light emitting device according to the embodiment including the sub-mount substrate 221, it is possible to configure the portion including the mounting region of the light emitting element 1 and the annular member 213 of different materials. In the exemplified light emitting device, the sub-mount substrate 221 is made essentially of silicon, and the annular member 213 is made essentially of ceramics. As it is possible to configure the portion including the mounting region of the light emitting element 1 and the annular member 213 of different materials, the light emitting device of the embodiment is improved with respect to heat control.

Figure 13:
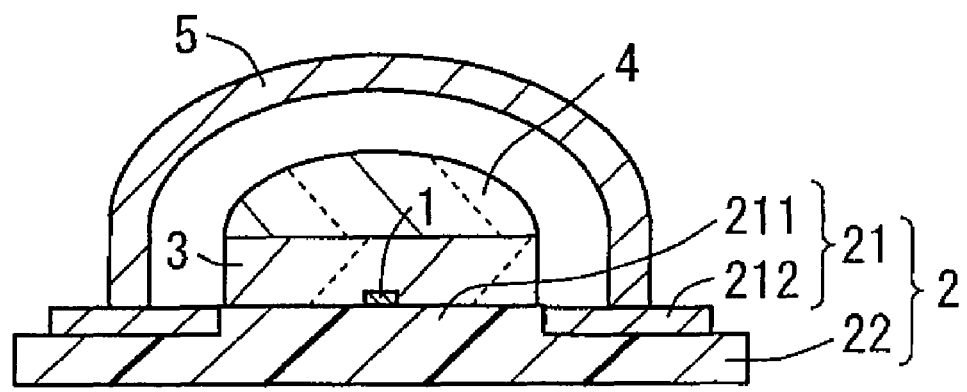
FIG. 13 illustrates a light emitting device according to another embodiment of the invention.

Referring to FIG. 13, another embodiment of the invention will be described. A light emitting device according to another embodiment includes the light emitting element 1, the base 2, and the transparent layer 3, in the same way as the light emitting device illustrated in FIGS. 4 and 5. The light emitting device further includes the lens 4 and the wavelength converting member 5.

In the light emitting device according to another embodiment, a point differing from the light emitting device illustrated in FIGS. 4 and 5 is the structure relating to the first portion 211 of the base 2. In the embodiment, the first portion 211 is formed as a part of the sub-base 22.

The light emitting device of the embodiment is improved with respect to overall intensity due to the first portion 211 being formed as a part of the sub-base 22. Consequently, the light emitting device of the embodiment is improved with respect to light emitting characteristics such as luminescence distribution. Due to the first portion 211 being formed as a part of the sub-base 22, the number of parts of the light emitting device of the embodiment is reduced.

Figure 14:
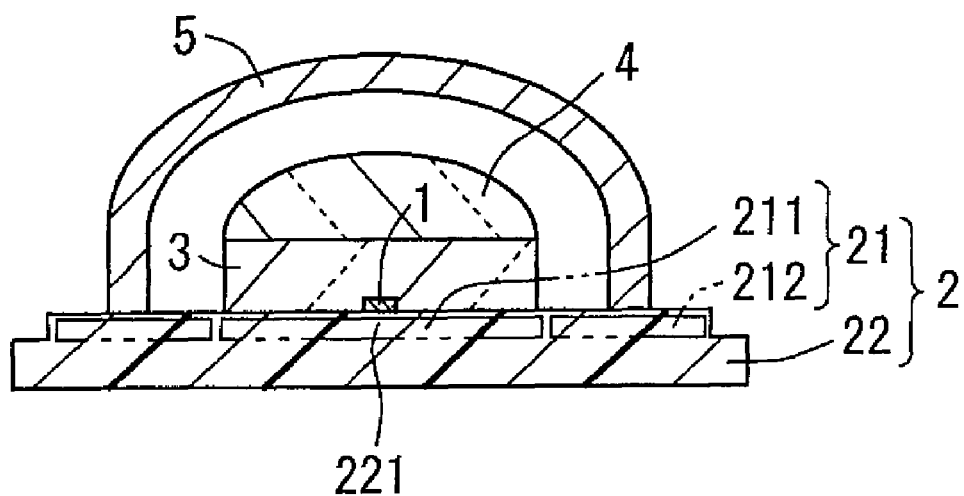
FIG. 14 illustrates a light emitting device according to another embodiment of the invention.

Referring to FIG. 14, another embodiment of the invention will be described. A light emitting device according to another embodiment includes the light emitting element 1, the base 2, and the transparent layer 3, in the same way as the light emitting device illustrated in FIGS. 4 and 5. The light emitting device further includes the lens 4 and the wavelength converting member 5.

In the light emitting device according to another embodiment, a point differing from the light emitting device illustrated in FIGS. 4 and 5 is the structure relating to the first portion 211 and second portion 212 of the base 2. In the embodiment, the first portion 211 and second portion 212 are formed as a part of the sub-base 22. The first portion 211 and second portion 212 are integrally formed.

The light emitting device of the embodiment is improved with respect to overall intensity due to the first portion 211 and second portion 212 being formed as a part of the sub-base 22. Consequently, the light emitting device of the embodiment is improved with respect to light emitting characteristics such as luminescence distribution. Due to the first portion 211 and second portion 212 being formed as a part of the sub-base 22, the number of parts of the light emitting device of the embodiment is reduced.

Figure 15:
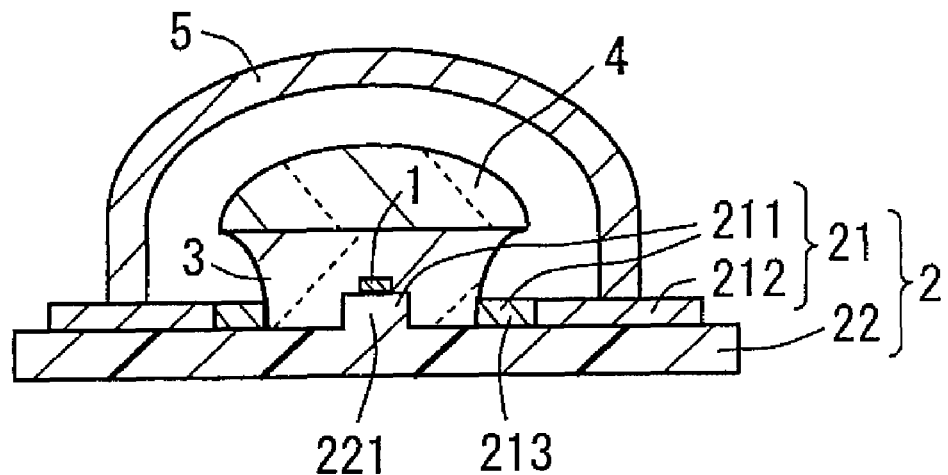
FIG. 15 illustrates a light emitting device according to another embodiment of the invention.

Referring to FIG. 15, another embodiment of the invention will be described. A light emitting device according to another embodiment includes the light emitting element 1, the base 2, and the transparent layer 3, in the same way as the light emitting device illustrated in FIGS. 4 and 5. The light emitting device further includes the lens 4 and the wavelength converting member 5.

In the light emitting device according to another embodiment, a point differing from the light emitting device illustrated in FIGS. 4 and 5 is the structure relating to the transparent layer 3. In the embodiment, the transparent layer 3 is partially in contact with the interior surface of the annular member 213. The transparent layer 3 partially enters a gap between the annular member 213 and protruding portion 221.

Due to the transparent layer 3 being partially in contact with the interior surface of the annular member 213, the light emitting device of the embodiment is improved with respect to the shape of the transparent layer 3. More specifically, in the manufacturing process, the transparent layer 3 in a softened state is controlled with respect to formation region or shape by the annular member 213. The light emitting device of the embodiment, by being improved with respect to the shape of the transparent layer 3, is improved with respect to light emitting characteristics such as luminescence distribution.

Figure 16:
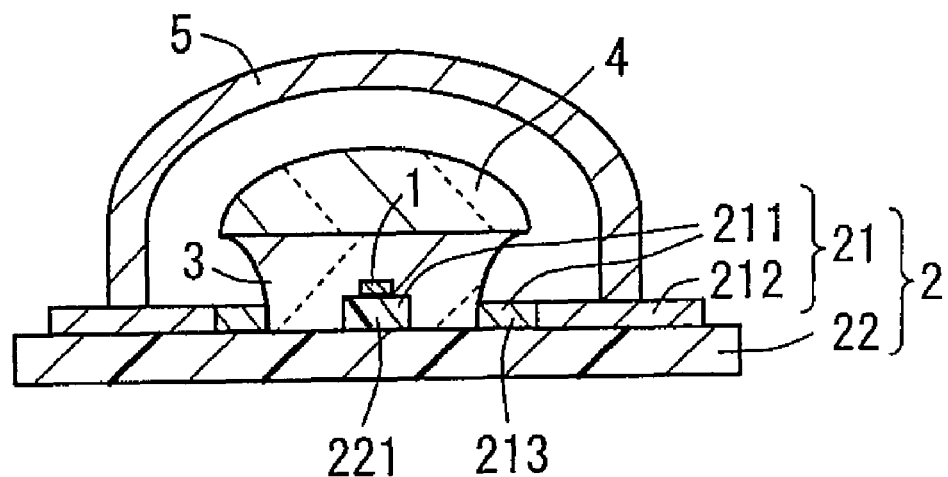
FIG. 16 illustrates a light emitting device according to another embodiment of the invention.

Referring to FIG. 16, another embodiment of the invention will be described. A light emitting device according to another embodiment includes the light emitting element 1, the base 2, and the transparent layer 3, in the same way as the light emitting device illustrated in FIG. 15. The light emitting device further includes the lens 4 and the wavelength converting member 5.

In the light emitting device according to another embodiment, a point differing from the light emitting device illustrated in FIG. 15 is the structure relating to the protruding portion 221 of the base 2. In the embodiment, the protruding portion 221 is a sub-mount substrate. Hereinafter, in the embodiment, the protruding portion 221 will be illustrated as the sub-mount substrate 221.

The light emitting device according to the embodiment is improved with respect to heat control by including the sub-mount substrate 221. More specifically, the light emitting device is improved with respect to heat control by including the sub-mount substrate 221, which has higher heat conductivity than the annular member 213. Consequently, the light emitting device according to the embodiment is improved with respect to light emitting characteristics.

Figure 17:
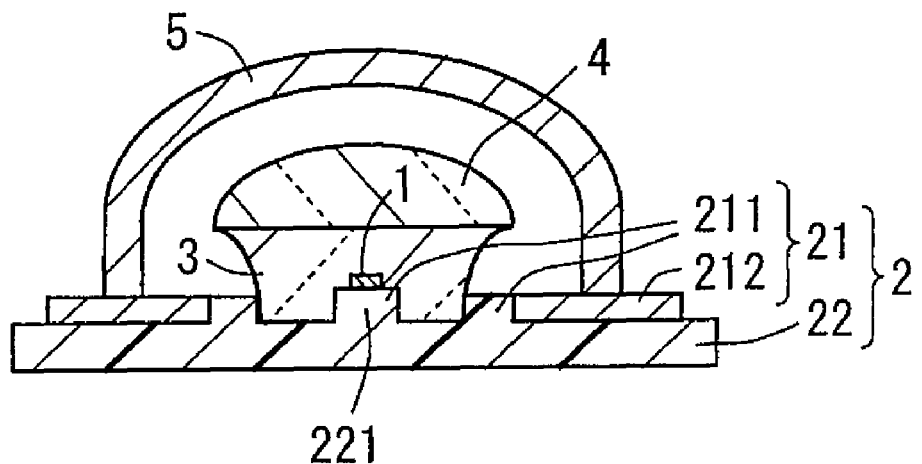
FIG. 17 illustrates a light emitting device according to another embodiment of the invention.

Referring to FIG. 17, another embodiment of the invention will be described. A light emitting device according to another embodiment includes the light emitting element 1, the base 2, and the transparent layer 3, in the same way as the light emitting device illustrated in FIG. 15. The light emitting device further includes the lens 4 and the wavelength converting member 5.

In the light emitting device according to another embodiment, a point differing from the light emitting device illustrated in FIG. 15 is the structure relating to the first portion 211 of the base 2. In the embodiment, the first portion 211 is formed as a part of the sub-base 22.

The light emitting device of the embodiment is improved with respect to overall intensity due to the first portion 211 being formed as a part of the sub-base 22. Consequently, the light emitting device of the embodiment is improved with respect to light emitting characteristics such as luminescence distribution. Due to the first portion 211 being formed as a part of the sub-base 22, the number of parts of the light emitting device of the embodiment is reduced.

Figure 18:
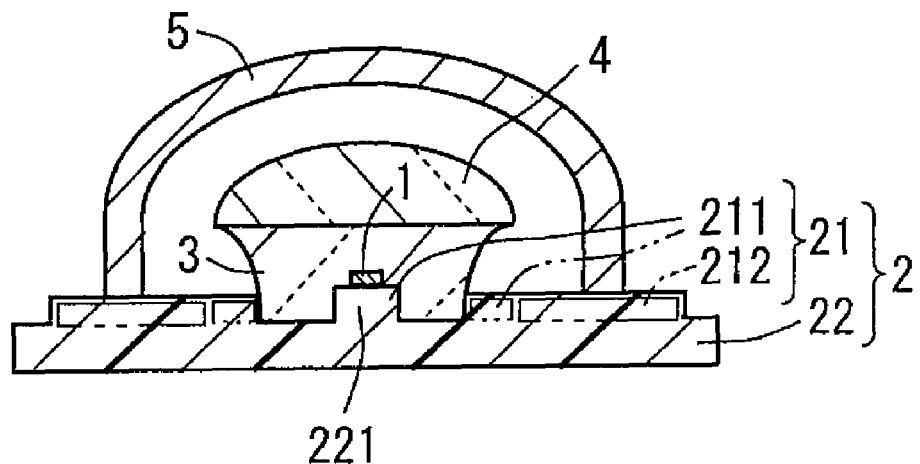
FIG. 18 illustrates a light emitting device according to another embodiment of the invention.

Referring to FIG. 18, another embodiment of the invention will be described. A light emitting device according to another embodiment includes the light emitting element 1, the base 2, and the transparent layer 3, in the same way as the light emitting device illustrated in FIG. 15. The light emitting device further includes the lens 4 and the wavelength converting member 5.

In the light emitting device according to another embodiment, a point differing from the light emitting device illustrated in FIG. 15 is the structure relating to the first portion 211 and second portion 212 of the base 2. In the embodiment, the first portion 211 and second portion 212 are formed as a part of the sub-base 22. The first portion 211 and second portion 212 are integrally formed.

The light emitting device of the embodiment is improved with respect to overall intensity due to the first portion 211 and second portion 212 being formed as a part of the sub-base 22. Consequently, the light emitting device of the embodiment is improved with respect to light emitting characteristics such as luminescence distribution. Due to the first portion 211 and second portion 212 being formed as a part of the sub-base 22, the number of parts of the light emitting device of the embodiment is reduced.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

The invention claimed is:

1. A light emitting device, comprising:
   a light emitting element;
   a base having an upper side portion including a first portion and a second portion, the first portion includes a mounting region of the light emitting element, and has a first porosity, the second portion surrounds the first portion, includes a plurality of transparent particles, and has a second porosity larger than the first porosity; and
   a transparent layer encapsulating the light emitting element, and being attached to the first portion in a state where the light transparent layer is apart from the second portion,
   wherein the first portion has an annular member arranged apart from the mounting region.

2. The light emitting device according to claim 1, wherein the base has a sub-base that includes a protruding portion having the mounting region.

3. The light emitting device according to claim 1, wherein the base has a sub-mount substrate having the mounting region.

4. The light emitting device according to claim 3, wherein the sub-mount substrate includes silicon.

5. The light emitting device according to claim 3, wherein the sub-mount substrate includes ceramics.

6. The light emitting device according to claim 1, wherein the base has a sub-base including the first portion.

7. The light emitting device according to claim 1, wherein the transparent layer enters a gap between the mounting region and the annular member.

8. The light emitting device according to claim 1, further comprising a wavelength converting member that covers the light transmitting layer, and is bonded to the second portion.

9. The light emitting device according to claim 1, wherein the second portion includes ceramics.

* * * * *